United States Patent [19]

McLyman

[11] Patent Number: 5,103,163

[45] Date of Patent: Apr. 7, 1992

[54] CURRENT TRANSDUCER

[75] Inventor: W. T. McLyman, Idylwild, Calif.

[73] Assignee: California Institute of Technology, Pasadena, Calif.

[21] Appl. No.: 599,293

[22] Filed: Oct. 17, 1990

[51] Int. Cl.⁵ .................. G01R 1/20; G01R 33/06
[52] U.S. Cl. ..................... 324/117 H; 324/127
[58] Field of Search .......... 324/117 H, 127, 251; 307/309; 338/32 H; 336/221

[56] References Cited

U.S. PATENT DOCUMENTS

| | | | |
|---|---|---|---|
| 2,585,707 | 2/1952 | Warner | 324/119 |
| 3,320,520 | 5/1967 | Pear | 324/251 |
| 4,059,798 | 11/1977 | Dierker et al. | 324/127 |
| 4,234,846 | 11/1980 | Maringer | 324/117 |
| 4,414,510 | 11/1983 | Milkovic | 324/252 |
| 4,558,276 | 12/1985 | Comeau et al. | 324/117 H |
| 4,682,101 | 7/1987 | Cattaneo | 324/117 |
| 4,704,575 | 11/1987 | Arnoux et al. | 324/117 |
| 4,791,361 | 12/1988 | Beihoff et al. | 324/117 H |
| 4,823,075 | 4/1989 | Alley | 324/117 H |
| 4,893,073 | 1/1990 | McDonald et al. | 324/127 |

FOREIGN PATENT DOCUMENTS

| | | | |
|---|---|---|---|
| 213972 | 3/1968 | U.S.S.R. | 324/117 H |
| 2219864 | 12/1989 | United Kingdom | 324/117 H |

*Primary Examiner*—Ernest F. Karlsen
*Attorney, Agent, or Firm*—Norman E. Brunell

[57] ABSTRACT

A current transducer for rugged environments uses a solid permalloy core including a magnetic gap for a Hall effect generator and rigid mounting extensions.

4 Claims, 1 Drawing Sheet

CURRENT TRANSDUCER

ORIGIN OF THE INVENTION

The invention described herein was made in the performance of work under a NASA contract, and is subject to the provisions of Public Law 96-517 (35 USC 202) in which the Contractor has elected to retain title.

BACKGROUND OF THE INVENTION

1. Field of the Invention

The present invention relates to current transducers and, in particular, to current transducers using Hall effect crystals as sensors.

2. Description of the Prior Art

Conventional current transducers using Hall effect crystals position the crystals in a gap formed in an electromagnetic core. The current to be measured is applied to a coil wrapped around the core. The strength of the resultant magnetic field is proportional to the applied current. The impedance of the Hall effect crystal is proportional to the strength of the magnetic field applied perpendicular to the crystal. A source of constant current is applied to the crystal so that the resultant voltage across the crystal is proportional to the magnetic field and therefore to the current applied to the coil.

Cores for such current transducers have conventionally been manufactured from wound permalloy tape or sintered, molded powder cores similar to those used in other electromagnet applications. Such cores are difficult to mount and susceptible to temperature variations and physical vibration.

What is needed is an improved current transducer which is relatively insensitive to temperature extremes and physical vibration as found in difficult environments, such as space. Such transducers should include cores which are very rugged and easily mounted.

SUMMARY OF THE INVENTION

The preceding and other shortcomings of the prior art are addressed and overcome by the present invention that provides, in a first aspect, an electromagnetic core for use in a current transducer, including a solid core body including an electromagnetic gap for a magnetic field sensor, and mounting extensions formed in the core body for rigidly mounting the core.

In another aspect, the invention provides a current transducer, including a one piece solid electromagnetic core, a current sense coil wound on the core, a Hall effect generator in a gap in the core, a constant current source connected to excite the generator, means responsive to the generator for measuring the current in the sense coil, and extension means rigidly fixed to the core for mounting the current transducer.

In a still further aspect, the invention provides a method for measuring current by forming an electromagnetic core from a single, solid block of ferromagnetic material including a magnetic gap and rigid mounting extensions, applying the current to a sense coil wound around the core, positioning a Hall effect generator in the magnetic gap, applying a constant current source to the Hall effect generator, and measuring the resultant voltage across the generator.

The foregoing and additional features and advantages of this invention will become further apparent from the detailed description and accompanying drawing figure or figures that follow. In the figures and written description, numerals indicate the various features of the invention, like numerals referring to like features throughout both the drawing figures and the written description.

DETAILED DESCRIPTION OF THE PREFERRED EMBODIMENT

Figure 1:
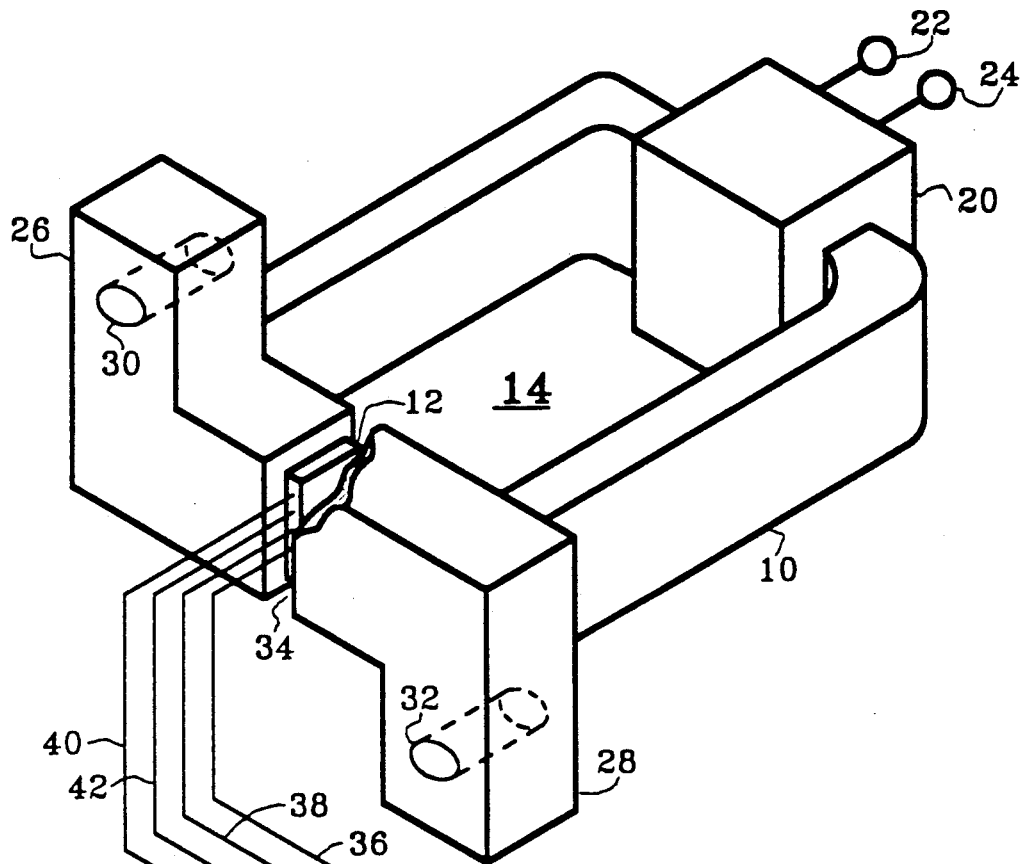
FIG. 1 is an isometric view of an electromagnetic core and Hall effect generator for a current transducer according to the present invention including a schematic diagram of the constant current source and instrumentation amplifier used therewith.
Figure 1:
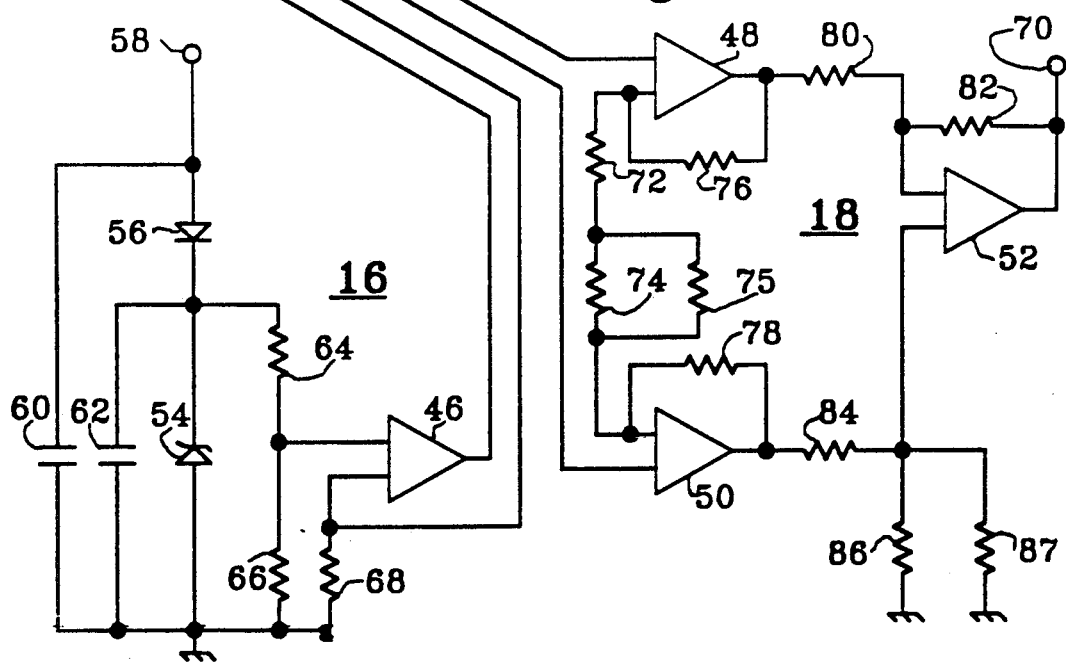

FIG. 1 is an isometric view of electromagnetic core 10 and Hall effect generator 12 for current transducer 14 according to the present invention including a schematic diagram of constant current source 16 and instrumentation amplifier 18 used therewith.

Electromagnetic core 10 may conveniently be machined from a solid block of electromagnetic material, such as permalloy 80. Conventional electromagnetic cores, as noted above, intentionally use non-solid materials for the cores. Wound permalloy tape or molded sintered powder cores are used to maximize the magnetic field generated in the electromagnetic core for a given current.

In accordance with the present invention, a more rugged temperature and vibration resistant core is configured from a solid block of ferromagnetic material. The resultant reduced magnetic field is acceptable in the current transducer disclosed herein because the absolute strength of the generated magnetic field is not of primary concern.

The magnetic field is generated in electromagnetic core 10 by current sense coil 20 which surrounds a portion of the core. The current to be measured is applied to current sense coil 20 via terminals 22 and 24. The number of turns of wire in current sense coil 20 is a function of the magnitude of the current to be detected and may be determined according to known principles.

Electromagnetic core 10 is formed from a solid block of ferromagnetic material and may therefore conveniently by configured with appropriate mounting portions, such as extensions 26 and 28, as shown in FIG. 1. Included within each extension 26 and 28 are openings 30 and 32, respectively, which may conveniently be used with mounting hardware, such as a nut and bolt, to fasten electromagnetic core 10 securely to a non-ferrous mounting surface, such as an aluminum bulkhead, not shown.

Electromagnetic core 10 is formed with gap 34 between arms of the core, in which Hall effect generator 12 is positioned. The lines of electromagnetic flux flowing between extensions 26 and 28 pass through Hall effect generator 12 normal to the surface thereof. A constant current is applied to Hall effect generator 12 by constant current source 16 via source terminals 40 and 42. The resultant voltage appearing between measurement terminals 36 and 38 of Hall effect generator 12 is proportional to the magnetic field across gap 34 and may be measured by instrumentation amplifier 18.

One of the main goals of the present invention is to provide a current transducer assembly which is relatively insensitive to temperature effects and capable of operation from a single, fixed voltage source. For this reason, constant current source 16 and instrumentation amplifier 18 are both configured from a single chip, quad amplifier operating from a single power supply, not shown. The quad amplifier includes operational amplifiers 46, 48, 50 and 52.

Constant current source 16 includes zener diode 54 in series with constant current diode 56 and power supply terminal 58 to provide a regulated constant current in a conventional constant current circuit including capacitors 60 and 62 and resistors 64, 66 and 68.

Instrumentation amplifier 18 includes the remaining amplifiers from the quad amp. In particular, the voltages generated by Hall effect generator 12 on measurement terminals 36 and 38 are applied to operational amplifiers 46 and 48 the outputs of which are combined in operational amplifier 52 and applied to output terminal 70. Instrumentation amplifier 18 is a conventional circuit design and includes resistors 72, 74, 76, 78, 80, 82, 84, 86 and 88.

Hall effect generator 12 may conveniently be the model GH-600 generator from F. W. Bell and the remaining component designations and values may be as follows:

amplifiers 46, 48, 50 and 52: LM 124 Quad
  zener diode 54: IN5295
  constant current diode 56: IN4566A
  capacitor 60, 62: 0.1 μf, 50 V
  resistor 64: 16.9 K
  resistor 66: 3.1 K
  resistor 68: 200 Ω
  resistor 72: 487 Ω
  resistor 74: 1.43 K
  resistor 75: 2 K–10 K
  resistor 76, 78, 80, 82, 84: 100 K
  resistor 86: 324 K
  resistor 87: 10 K–750 K Note that the component values for resistors 75 and 87 are indicated to be within a range. Particular resistors may be selected within this range to adjust the output range full scale as desired. Alternatively, potentiometers with this range of resistance values could be used.

While this invention has been described with reference to its presently preferred embodiments, its scope is not limited thereto. Rather, such scope is only limited in so far as defined by the following set of claims and includes all equivalents thereof.

What is claimed is:

1. A current transducer, comprising:
   a one piece solid electromagnetic core having a gap between ends thereof;
   a current sense coil wound on the core;
   a Hall effect generator in the gap in the core;
   a constant current source for exciting the generator;
   means responsive to the generator for measuring the current in the sense coil; and
   extension means rigidly fixed to the ends of the core surrounding the gap for mounting the current transducer to control gap spacing.

2. The current transducer claimed in claim 1, wherein the constant current source and the means for measuring sense coil current both further comprise:
   active electronic elements formed from portions of a single electronic component to minimize temperature errors.

3. The current transducer claimed in claim 1, wherein the one piece solid electromagnetic core is rigid.

4. The method for measuring current, comprising:
   forming an electromagnetic core from a single, solid block of ferromagnetic material including a magnetic gap and rigid mounting extensions surrounding the gap;
   rigidly mounting the extensions to control gap spacing;
   applying the current to a sense coil wound around the core;
   positioning a Hall effect generator in the magnetic gap;
   applying a constant current source to the Hall effect generator; and
   measuring the resultant voltage across the generator.

* * * * *